United States Patent [19]

Dohler et al.

[11] Patent Number: 4,883,770

[45] Date of Patent: Nov. 28, 1989

[54] SELECTIVE NIPI DOPING SUPER LATTICE CONTACTS AND OTHER SEMICONDUCTOR DEVICE STRUCTURES FORMED BY SHADOW MASKING FABRICATION

[75] Inventors: Gottfried H. Dohler, Palo Alto; Ghulam Hasnain, Mtn. View; Jeffrey N. Miller, Los Altos, all of Calif.

[73] Assignee: Hewlett-Packard Company, Palo Alto, Calif.

[21] Appl. No.: 298,794

[22] Filed: Jan. 17, 1989

Related U.S. Application Data

[63] Continuation of Ser. No. 909,734, Sep. 19, 1986, abandoned.

[51] Int. Cl.$^4$ ............... H01L 21/20; H01L 21/203
[52] U.S. Cl. ............: ............ 437/110; 148/DIG. 26; 148/DIG. 41; 148/DIG. 72; 148/DIG. 104; 148/DIG. 160; 148/DIG. 169; 156/612; 357/16; 437/80; 437/105; 437/107; 437/133; 437/948
[58] Field of Search ............ 148/DIG. 26, 41, 72, 148/104, 145, 160, 169; 156/610–615; 357/16, 17, 91; 437/80, 105, 107, 110, 128, 133, 948

[56] References Cited

U.S. PATENT DOCUMENTS

| | | | |
|---|---|---|---|
| 3,915,765 | 10/1975 | Cho et al. | 148/175 |
| 4,111,725 | 9/1978 | Cho et al. | 148/175 |
| 4,171,234 | 10/1979 | Nagata et al. | 437/167 |
| 4,309,670 | 1/1982 | Burnham et al. | 29/576 E |
| 4,470,192 | 9/1984 | Miller | 29/576 B |

OTHER PUBLICATIONS

Cho et al., "Growth of Three-Dimensional Dielectric Waveguides" Appl. Phys. Lett., vol. 21, No. 8, 15 Oct. 1972, pp. 355–356.
Miyauchi et al., "Maskless Ion Beam Writing of Precise Doping Patterns with Be and Si . . . GaAs," J. Vac. Sci. Technol. B. 4(1), Jan/Feb. 1986, pp. 189–193.
A. Y. Cho, "Recent Developments in Molecular Beam Epitaxy," J. Vac. Sci. Technol., vol. 16, No. 2, Mar.-/Apr. 1979, pp. 275–284.
Tsang et al., "Selective Area Growth of GaAs/AlGa As Multilayer . . .", Appl. Phys. Lett. vol. 31 No. 4, 15 Aug. 1977, pp. 302–304.
Tsang et al., "Growth of GaAs-GaAl As over Preferentially Etched Channels . . . ", Appl. Phys. Lett., vol. 30, No. 6, 15 Mar. 1977, pp. 293–296.
Chang et al., "Source Shaping in the Fabrication of . . . Light Emitting Diodes . . . ", IBM TDB, vol. 15, No. 1, Jun. 1972, pp. 180–182.
Dohler et al., "In Situ Groon-in Selective Contacts to N-i-P-i Doping Superlattice Crystals . . . ", Appl. Phys. Lett., 49(12), 22 Sept. 1986, pp. 704–706.
Nov. 1983 Scientific American Article by Gottfried H. Doehler Entitled Solid-State Superlattices, pp. 144–151.
Gottfried, H. Doehler, "High-Speed n-i-p-i Photodetector with Internal Gain", Superlattices and Microstructures, vol. i, No. 5, 1985.

Primary Examiner—Brian E. Hearn
Assistant Examiner—William Bunch
Attorney, Agent, or Firm—John A. Frazzini

[57] ABSTRACT

A molecular beam epitaxy (MBE) process in which some portions of the substrate are shadowed by a shadow mask from receiving at least one of the molecular beams used in the MBE process. This process is capable of producing NIPI superlattices that have selective contacts that are far superior to those which can be produced at present. This technique can also produce a wide variety of NIPI devices as well as other types of IC structures.

11 Claims, 9 Drawing Sheets

SELECTIVE NIPI DOPING SUPER LATTICE CONTACTS AND OTHER SEMICONDUCTOR DEVICE STRUCTURES FORMED BY SHADOW MASKING FABRICATION

This is a continuation of Ser. No. 909,734, filed 9/19/86, now abandoned.

BACKGROUND OF THE INVENTION

This invention relates in general to a new semiconductor device fabrication method and relates more particularly to the production of selective contacts for a NIPI doping superlattice structure. The general theory of superlattices is presented in an article by Gottfried H. Doehler entitled SOLID-STATE SUPERLATTICES published in the November 1983 issue of Scientific American page 144–151. Superlattices are of interest because they have interesting electrical and optical properties because their electrical and optical properties can be adjusted by the choice of parameters of the superlattice.

There are two types of superlattices: a compositional superlattice (also called a heterostructure superlattice) and a doping superlattice. A compositional superlattice is a periodic array of ultrathin layers of two different semiconductors in alternation. Each layer is no more than a few hundred atoms thick so that there is significant interaction between adjacent layers. The composition of the two layers is selected so that they have a compatible lattice structure and so that the band gap in one of the layers is not equal to that in the other layer. The effect of this is that the bottom of the conduction band exhibits a potential well for electrons in each of the smaller band gap layers and exhibits a potential barrier in each of the larger band gap layers. Likewise, the top of the valence band exhibits a periodic array of potential wells for holes. One such superlattice consists of an alternating sequence of layers of gallium arsenide (GaAs) and aluminum gallium arsenide (AlGsAs). These potential wells break the conduction band into a series of minibands and significantly affect the electrical and optical properties of the superlattice.

A doping superlattice consists of an alternating sequence of n and p doped layers in a substrate. These doped layers may, but need not, be separated by layers of undoped (intrinsic) substrate. The doping superlattice is also referred to as a NIPI superlattice. The diffusion of electrons from the n-type layers into the p-type layers and the diffusion of holes from the p-type layers into the n-type layers results in a periodic charge variation in the superlattice that produces a periodic variation in the bottom of the conduction band and in the top of the valence band, thereby producing a periodic array of potential wells as in a compositional superlattice. This also results in a separation between the holes and the electrons so that the recombination time for holes with electrons is greatly increased. When excited optically or electrically, a large number of excess holes and electrons are created which flatten the periodic potential and increase the effective band gap (defined as the distance between a minimum in the bottom of the conduction band and a maximum in the top of the valence band) of the superlattice from its ground state value. The electrical and optical properties can be varied by varying the number of holes and free electrons in the superlattice. To achieve this by electrical excitation, a pair of selective contacts need to be produced. The first selective contact needs to make a low impedance ohmic contact to the n-doped layers but not to the p-doped layers and the second selective contact must make a low impedance ohmic contact to the p-doped layers but not to the n-doped layer.

At present, selective contacts to the n- and p-type layers are formed respectively by depositing small tin (Sn) and tin/zinc (Sn/Zn) balls on the surface of the superlattice and then annealing the superlattice to diffuse these balls downward into the superlattice. The diffused tin and zinc atoms cause strong n-and p-doped regions below the surface of the superlattice, thereby producing the first and second selective contacts respectively. Unfortunately, these selective contacts are far from ideal The sizes of the balls are variable so that reproducible results are not achieved. The deposited balls are quite large on the scale of present integrated circuit features so that the resulting contacts are equally large making this process unsuited for miniaturization. The large surface area of these contacts results in a large leakage current and also, because of band gap states at the interface between these contacts and the superlattice, results in a high recombination rate. Extremely low luminescence efficiency at room temperature results because of this undesirable non-radiative recombination at the selective contacts. Therefore, it would be advantageous to develop a method that enables the production of selective contacts that are not limited by these problems.

SUMMARY OF THE INVENTION

In accordance with the illustrated preferred embodiment, a fabrication method is presented that enables the production of NIPI superlattices having in situ selective contacts. A set of sources supply a set of molecular beams that are used to grow the bulk material of the superlattice and to supply the dopants used to produce the n- and p-doped regions. A shadow mask is located between the dopant beams and a substrate on which the NIPI superlattice is to be generated. The shadow mask shields a first region of the substrate from the n-dopant and shields a second region of the substrate from the p-dopant. Between the first and second regions is a third region in which both n- and p-dopants are incident.

As the bulk material is being deposited on the substrate, the n- and p- dopant beams are controllably turned on and off to produce a NIPI superlattice in the third region. Because of the shadow mask, each of the p-doped layers extends into the first region but not into the second region and each of the n-doped regions extends into the second region but not into the first region. Thus, the first region contains a PIPI structure and the second region contains an NINI structure. A first conductor is brought into contact with the NINI layers to form a first selective contact to the n-doped layers of the NIPI superlattice. Likewise, a second conductor is brought into contact with the PIPI layers to form a second selective contact to the p-doped layers of the NIPI superlattice.

Figure 2:
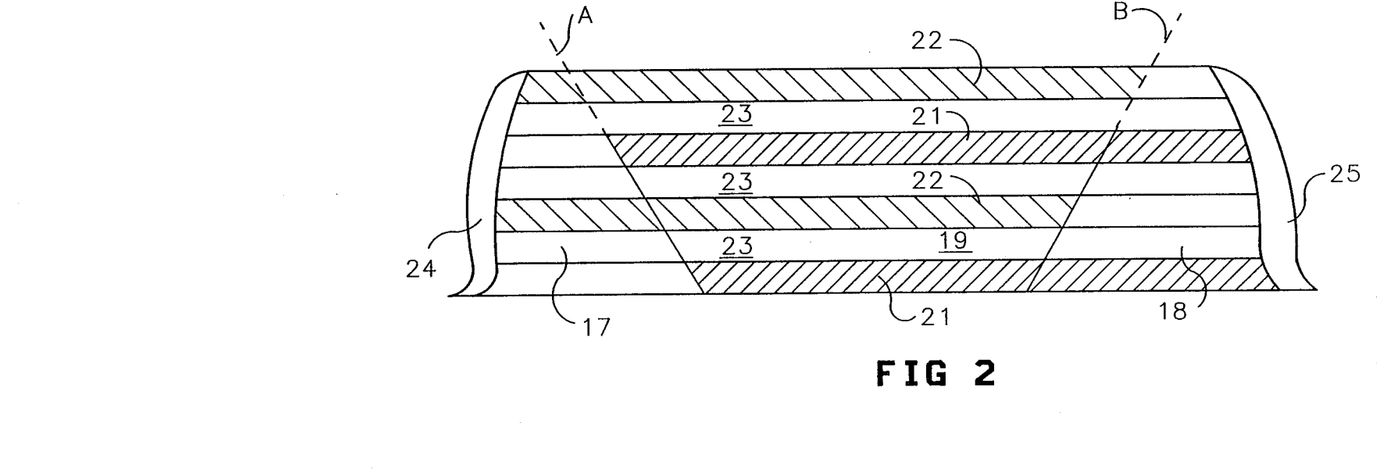
FIG. 2 shows the NIPI structure produced by the process illustrated in FIG. 1.
Figure 3A:
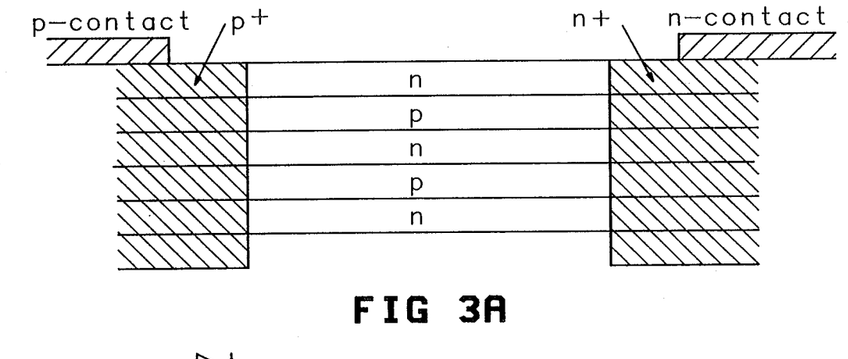
FIG. 3A is a schematic diagram of the NIPI superlattice having selective contacts discussed in the Summary of the Invention.
Figure 3B:
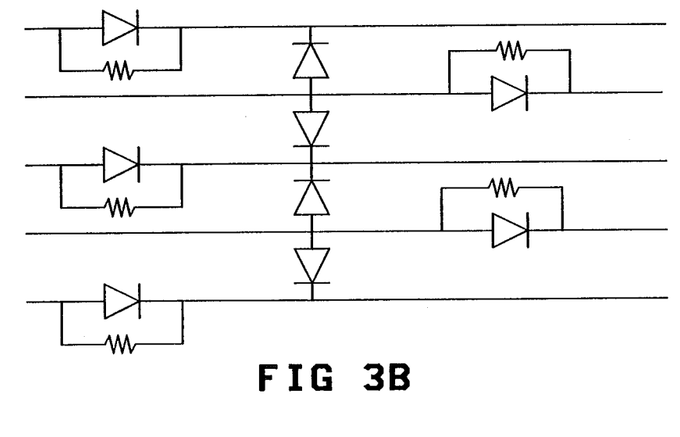
FIG. 3B is an equivalent circuit of the circuit shown in FIG. 3A.
Figure 4A:
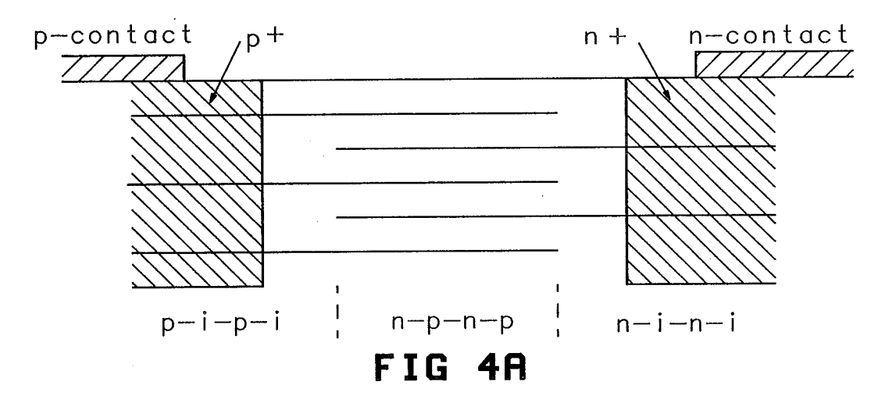
FIG. 4A is a schematic diagram of the NIPI superlattice of FIG. 2.
Figure 4B:
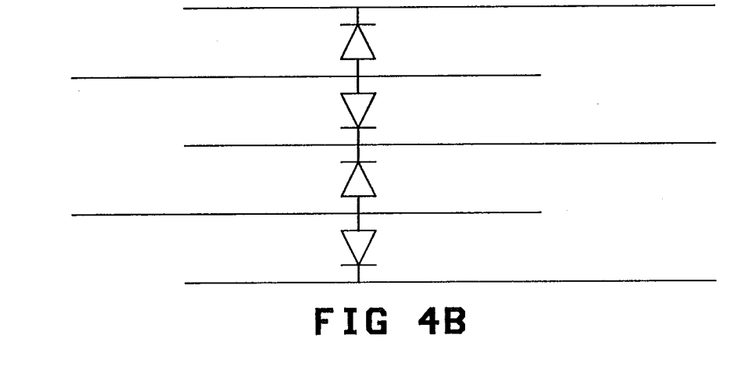
FIG. 4B is an equivalent circuit of the circuit shown in FIG. 4A.

These selective contacts are far superior to the selective contacts discussed in the Background of the Invention. In FIG. 3A is shown a schematic diagram of the selective contacts discussed in the Background of the invention. The equivalent circuit for those contacts is shown in FIG. 3B. Similarly, the schematic diagram and the equivalent circuit for the selective contacts of FIG. 2 are shown in FIGS. 4A and 4B, respectively. Because the first conductor is separated by intrinsic regions from the p-doped layers and because the second conductor is separated by intrinsic regions from the n-doped layers the equivalent circuit in FIG. 4B lacks the leaky pn junctions present in FIG. 3B.

The shadow mask can be formed from a number of materials, but should satisfy the following properties. In order to avoid introducing contaminants into the process, the mask material should not outgas in the ultra high vacuum system used in a molecular beam epitaxy (MBE) system. The mask should also withstand high temperatures (up to 1000 degrees Centigrade), should not be fragile and should be easy to clean to remove any impurities before use in the MBE system.

This shadow masking technique has much greater versatility than just producing selective contacts to NIPI superlattices. A NIPI structure as discussed above having one selective n-type contact and one selective p-type contact can be produced with a shadow mask having one rectangular aperture therethrough. A NIPI structure having two n-type and two p-type selective contacts can be produced using a mask having a cross-shaped aperture therethrough and having multiple n- and p-type sources located to produce two NINI regions and two PIPI regions. Similarly, with a suitable arrangement of sources and a suitable shaped shadow mask, a NIPI photodetector array can be produced in which a central rectangular NIPI structure is used to detect light and a alternating array of NINI and PIPI regions are connected to the sides of the NIPI structure to make selective n- and p-type contacts along the length of the detector region. Other structures that can be produced include an optical wave guide with strong lateral confinement, lateral heterostructures, and a bipolar or heterojunction bipolar transistor having spatially separated n- and p- contacts for three or more terminal electronic devices.

DESCRIPTION OF THE FIGURES

FIGS. 5A-6D illustrate the use of a shadow mask having a cross-shaped aperture therethrough designed to produce a central NIPI region having two selective n-type contacts and two selective p-type contacts.

FIG. 6A-6D illustrate a process suitable for producing a NIPI superlattice photodiode array.

DESCRIPTION OF THE PREFERRED EMBODIMENT

Figure 1:
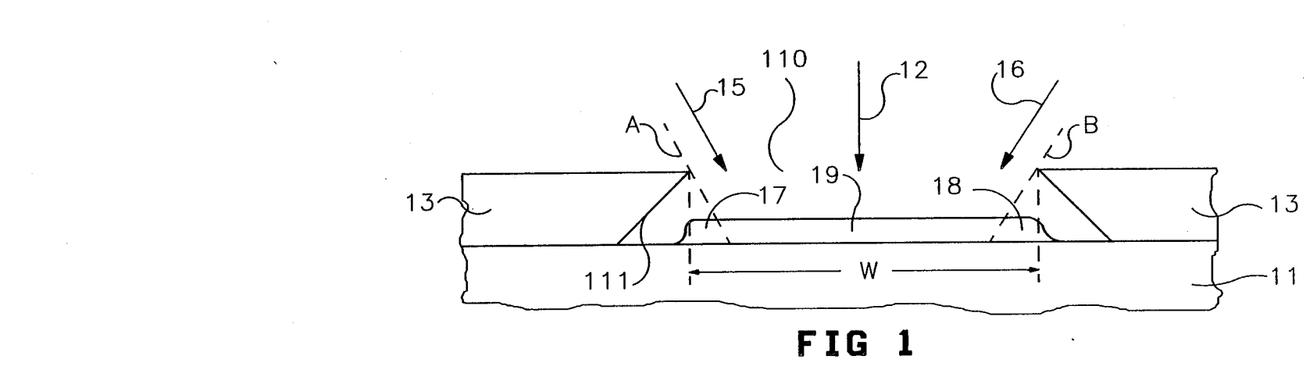
FIG. 1 illustrates the use of a shadow mask molecular beam epitaxy process to produce a NIPI structure having in situ selective contacts.

In FIG. 1 is shown a method of producing a NIPI doping superlattice having in situ selective contacts. The NIPI superlattice is grown on top of a substrate 11 by means of molecular beam epitaxy. "Molecular beam epitaxy" and "molecular beams" are to be interpreted herein to include not only molecular beams, but also to include atomic and ionic beams. These beams are supplied from sources located far enough away from substrate 11 that each beam is substantially collimated at substrate 11. The bulk material of the NIPI superlattice is provided from one or more molecular beam sources (depending on the choice of bulk material). These sources (not shown in this Figure) provide a molecular beam 12 that is incident on and perpendicular to the top surface of substrate 11.

A shadow mask 13 intercepts part of molecular beam 12 thereby defining where epitaxial growth occurs on substrate 11. Thus epitaxially grown layer 14 results having substantially the same shape and dimensions as an aperture 110 in mask 13. Thus, in FIG. 1 the width W of the epitaxial growth is substantially equal to the width of aperture 110. A source of n-type dopant is situated to produce a beam 15 incident on substrate 11 and a source of p-type dopant is situated to produce a beam 16 incident on substrate 11. These sources are located so that mask 13 shields epitaxial layer 14 from beam 15 in a first region 17 and shields epitaxial layer 14 from beam 16 in a second region 18. However, neither beam 15 or 16 is blocked from layer 14 in a third region 19. The boundary between regions 17 and 19 is determined by line A parallel to beam 15. Similarly, the boundary between regions 18 and 19 is determined by line B parallel to beam 16.

Beams 15 and 16 are controllably turned on and off such that a NIPI superlattice is grown in region 19. This NIPI superlattice is shown in greater detail in FIG. 2 for a simple NIPI superlattice having only two n-doped layers 21, two p-doped layer 22 and three intrinsic layers 23. In region 17 a PIPI structure results and in region 18 a NINI structure results. Conductors 24 and 25 are formed in contact with the ends of regions 17 and 18, respectively, thereby forming selective contact from conductor 24 to the p-type layers in the NIPI superlattice and forming selective contact from conductor 25 to the n-type layers in the NIPI superlattice. Intrinsic regions separate conductor 24 from the n-type layers and separate conductor 25 from the p-type layers in the NIPI superlattice so that these selective contacts exhibit negligible leakage current and negligible contribution to electron-hole recombination within the superlattice.

The shadow mask material should be chosen to avoid introducing contamination of the fabrication process. Thus, it should withstand high temperatures, should not be fragile or brittle, and should be inert enough to be cleaned thoroughly and should not outgas in the ultra low pressure of the MBE process. Silicon has served as a suitable choice. It is reasonably inexpensive, being available as silicon wafers. It can also be thoroughly cleaned by immersion in a solution of piranha ($H_2SO_4$:$H_2O_2$=5:1) for about 20 minutes, followed by immersion in concentrated HF for about 15 seconds to remove a thin layer of $SiO_2$ produced by the immersion in piranha. In addition, techniques for etching silicon wafers accurately are well known.

The dimensions of the regions that are to be selectively masked from some of the molecular beams are typically small enough that the shadow mask can be in actual contact with the substrate on which MBE growth is to take place. In fact, some geometries will be so small that a typical silicon wafer will be thicker (on the order of 300 microns) than is desired so that the thickness of the wafer will need to be reduced in the region in which apertures are to be produced to produce the mask. Alternatively, the mask can be etched twice to produce a reduced effective height by creating an edge profile like that in FIG. 7 instead of as in FIG. 6C.

Figure 5A:
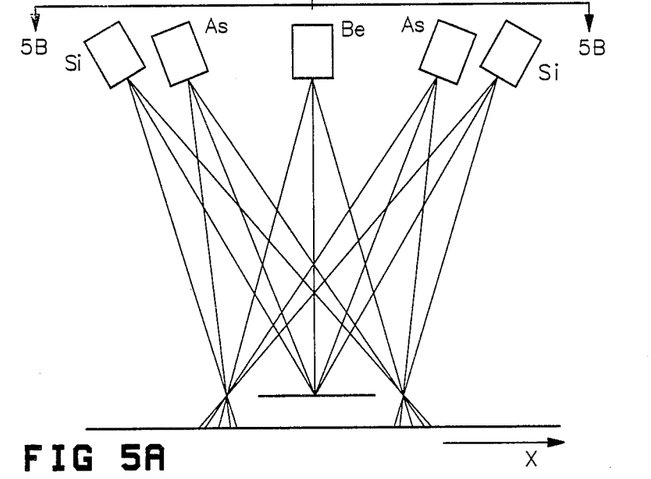
Figure 5B:
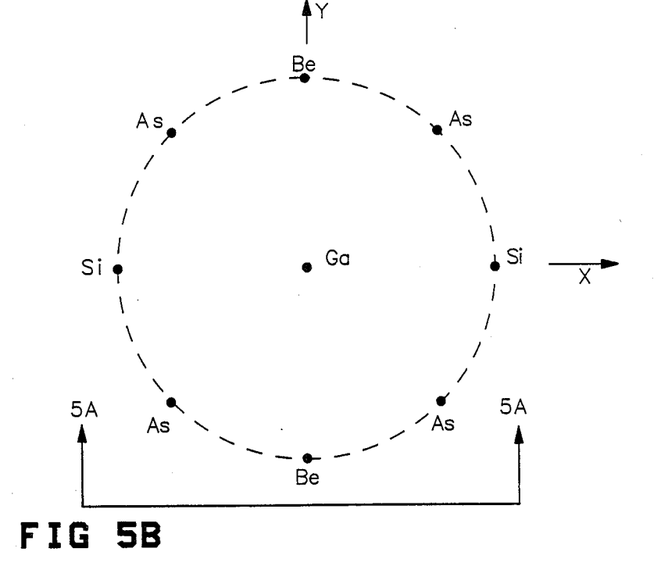
Figure 5C:
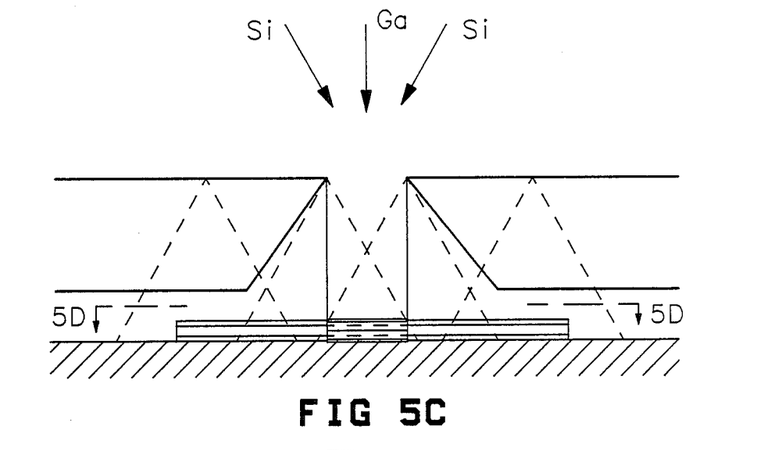
Figure 5D:
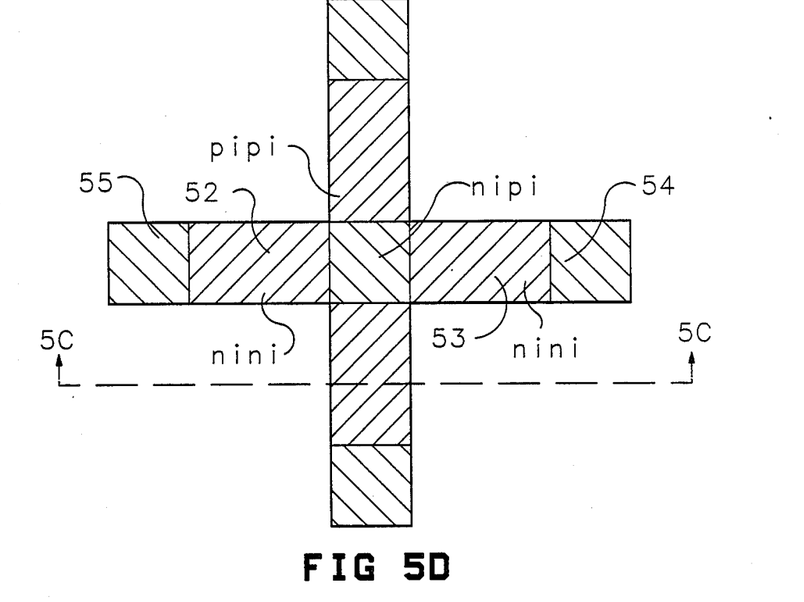

The NIPI superlattice of Figures can be produced by use of a mask having a rectangular aperture 110 therethrough. However, other more complicated structures can be produced by means of this shadow mask fabrication process using more complicated apertures and more complicated arrays of molecular beam sources. In FIGS. 5A-5D are illustrated a process suitable for producing a NIPI structure having two selective n-type contacts and two p-type selective contacts. This process uses a mask having a cross-shaped aperture through the mask. In FIGS. 5A and 5B are shown top and side views, respectively, of the arrangement of the molecular beam sources. In FIG. 5C is shown a side view of the shadow mask along a line through one leg of the cross-shaped aperture. FIG. 5D shows a top view of the resulting NIPI superlattice, NINI regions and PIPI regions. A NIPI superlattice is produced in region 51 in which the substrate is exposed to all of the dopant beams. In regions 52 and 53, the substrate is exposed by both Si beams but is not exposed by either Be beam and therefore an NINI superlattice is produced in those regions. In regions 54 and 55, the substrate is exposed by only one of the Si beams and therefore a lighter doped NINI superlattice is produced in those regions.

The locations of the As sources results in exposure by As of the substrate in a region that is bigger than and includes the region exposed to Ga atoms. Thus, GaAs is grown on the substrate in the entire region exposed by the GaAs atoms thereby reproducing the shape of the mask.

Figure 6A:
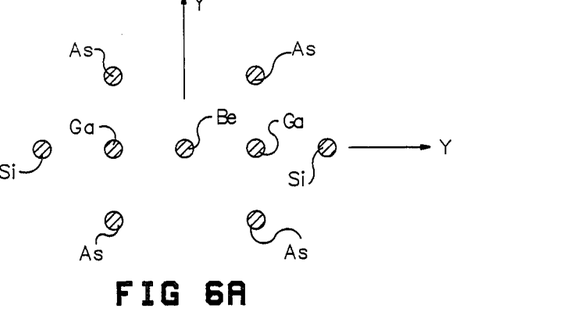
Figure 6B:
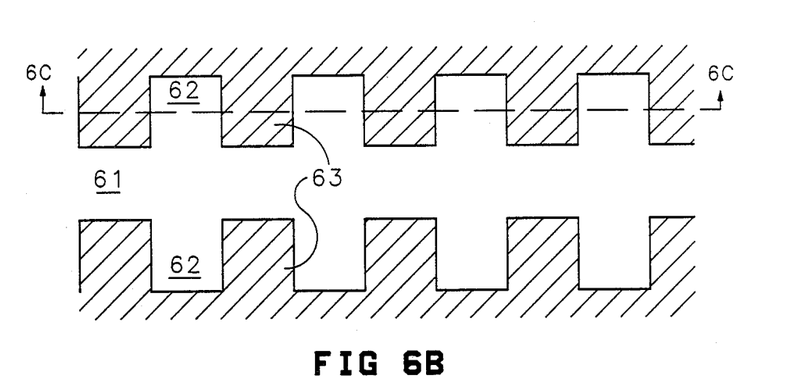
Figure 6C:
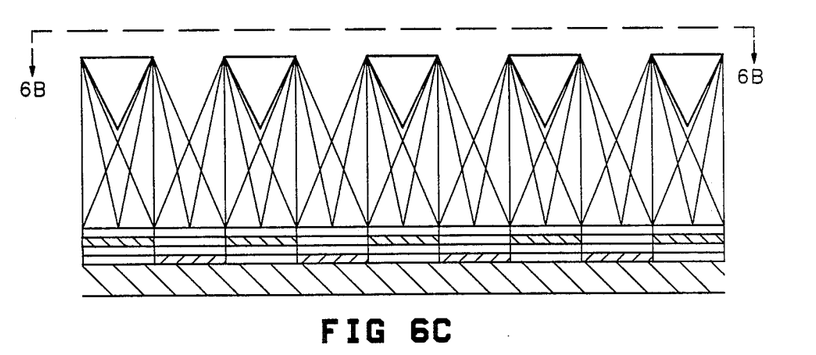
Figure 6D:
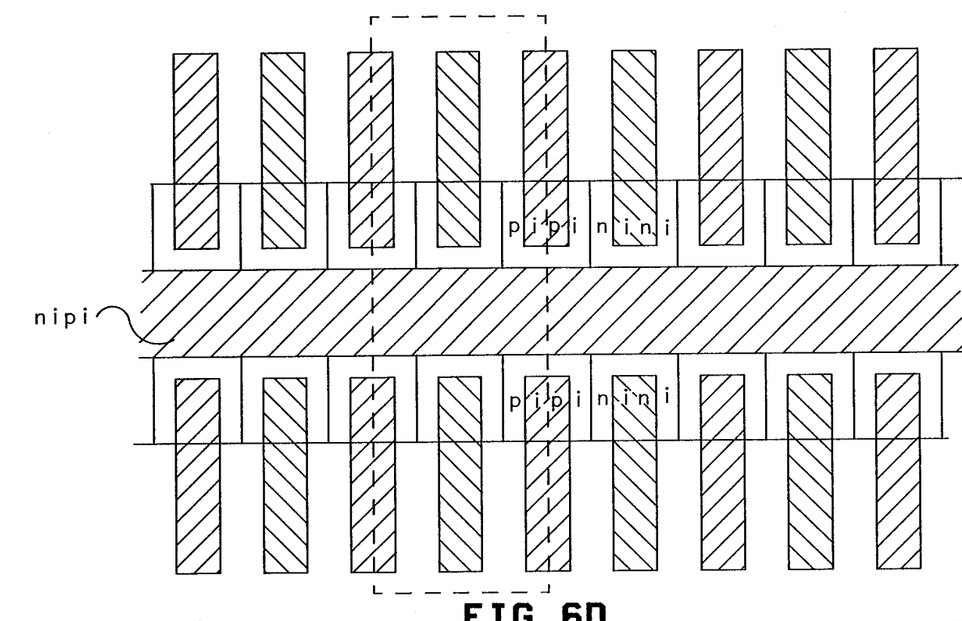
Figure 7:
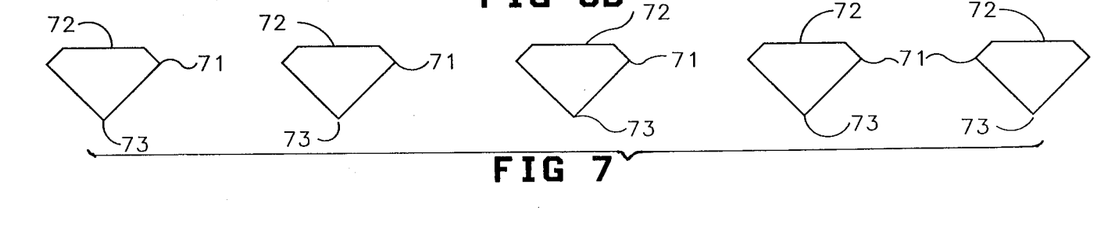
FIG. 7 illustrates an edge profile of a shadow mask that has been modified to have a reduced effective height.

In FIGS. 6A-6D are illustrated a process suitable for producing a NIPI superlattice photodiode array. In FIG. 6A is a top view of the molecular beam sources. In FIG. 6C is a top view of the shadow mask and in FIG. 6C is a side view of the shadow mask along the line indicated in FIG. 6B. The aperture in the mask includes a rectangular portion 61 under which the NIPI detector is to be produced. Along both sides of rectangular portion 61 are symmetrically arranged a periodic array of rectangular recesses separated by rectangular opaque regions 63. Because the Be source provides a beam substantially perpendicular to the mask and the substrate, the regions under regions 61 and 62 are controllably exposed by Be atoms. The Si sources are positioned so that the portions of the substrate directly under regions 61 and 63 are exposed by Si atoms. Thus, a NIPI photodetector is produced directly under region 61, PIPI contact regions are produced under each of regions 62 and NINI contact regions are produced under each of regions 63. Ohmic n-doped contacts are made to each of the NINI regions and ohmic p-doped contacts are made to each of the PIPI regions. The resulting photodiode array is shown in FIG. 6D.

The composition of the bulk material grown by this MBE process can be varied by varying the constituent beams in addition to varying the dopant concentrations. For example, selective contacts can be used for lateral injection into a central, undoped region of a lateral double heterostructure grown by shadowing one of the constituent beams. This will enable surface emitting lateral as well as vertical double heterostructure lasers to be produced by this fabrication method.

Figure 8A:
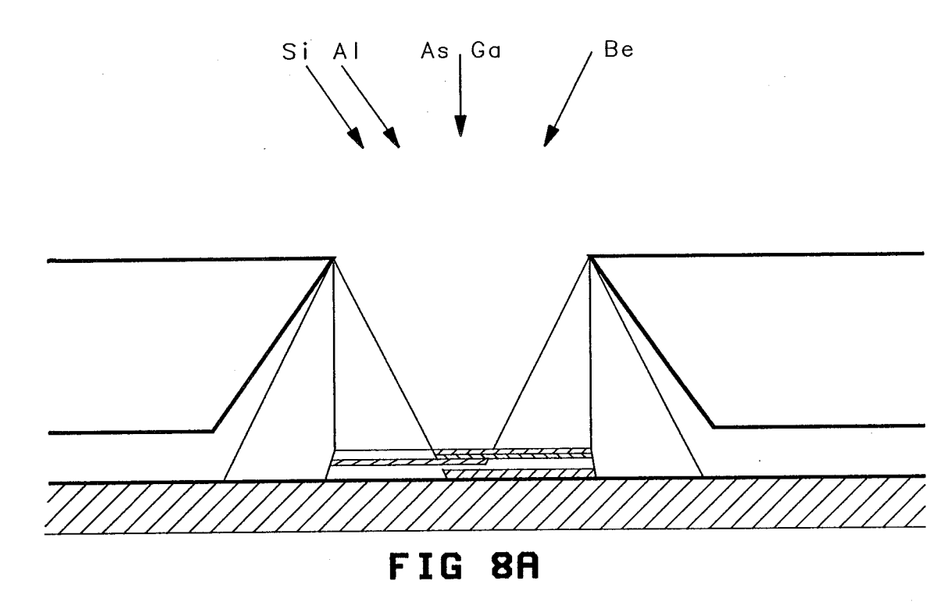
FIGS. 8A and 8B illustrate a shadow masking process for producing a bipolar or heterojunction bipolar transistor having three terminals.
Figure 8B:
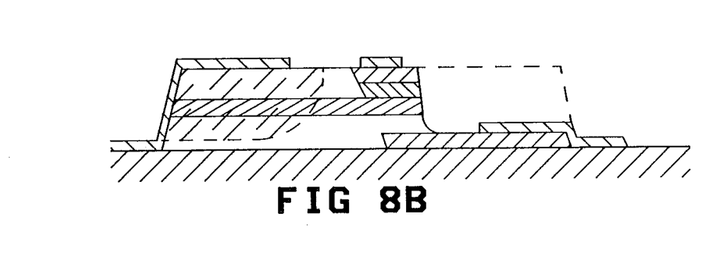

In FIGS. 8A and 8B are illustrated a shadow masking process for producing a bipolar or heterojunction bipolar transistor having three terminals. FIG. 8A shows the structure produced by the shadow masking process. In FIG. 8, this structure has be etched to form a mesa to which three contacts have been formed.

Figure 9:
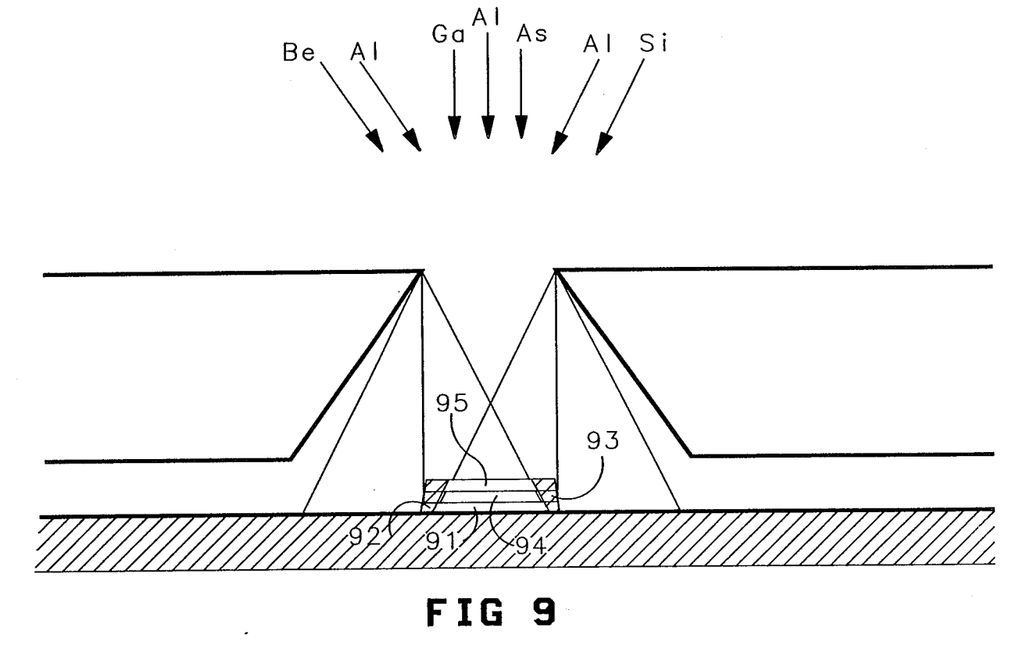
FIG. 9 illustrates a shadow masking process for producing a a waveguide having both lateral and vertical heterostructures.

In FIG. 1, the n- and p-dopant beams were selected to overlap so that a NIPI region was produced between a NINI region and a PIPI region. Alternatively, the beams can be chosen so that there is no overlap. In such a case, there would be produced an NINI region separated from a PIPI region by an undoped (intrinsic) region. Such an arrangement can be used to produce a PIN diode and can also be used to produce the structure in FIG. 9. In FIG. 9 is shown a shadow mask fabrication process suitable for producing a waveguide. In this process, the two leftmost sources produce parallel beams that, at the substrate, do not overlap the parallel beams produced by the rightmost two sources. Regions 91 and 95 consist of undoped materials of higher bandgap than the material in region 94. Regions 92 and 93 consist of doped materials of higher bandgap than the material in region 94. This results in a lower index of refraction in region 94 than in the other 4 regions so that this structure functions as a waveguide that is strongly confined in both lateral and vertical directions.

We claim:

1. A semiconductor fabrication process comprising the steps of:
   (a) exposing a substrate by a plurality of molecular beams to produce a epitaxially grown layer on the substrate, said beams being directed along a plurality of directions; and
   (b) blocking at least one beam with a mask having therein at least one aperture that enables a first of said beams to expose the substrate only in a first region and a second region and that enables a second of said beams to expose the substrate only in the second region and in a third region, said three regions being nonoverlapping and said second region being contiguous to the first and third regions, said beams being selected to form a first type of selective contact from the first region to the second region and form a second type of selective contact form the third region to the second region.

2. A process as in claim 1 further comprising the step of:
   (c) turning the first beam alternately on and off, thereby forming in the first an second regions a plurality of layers of epitaxially grown material that include particles from said first beam, these layers being separated by layers that do not include particles from said first beam.

3. A process as in claim 2 further comprising the step of:
   (d) turning the second beam alternatley on and off thereby forming in the second and third regions a plurality of layers of epitaxially grown material that include particles from said second beam, these layers being separated by layers that do not include particles from said second beam.

4. A process as in claim 3 further comprising before step
(a) the steps of:
selecting the first beam to contain an n-type dopant; and
selecting the second beam to contain a p-type dopant, whereby a dopant superlattice is formed in the second region and selective n- and p-type contacts are formed to the dopant superlattice from the first and third regions, respectively.

5. A process as in claim 3 further comprising before step (a) the steps of:
selecting the composition of the first beam so that the layers exposed by the first beam form in the second region a first type of layer of a compositional superlattice; and
selecting the composition of the second beam so that the layers exposed by the second beam form in the second region a second type of layer of said compositional superlattice, whereby, in the first region the layers exposed by the first beam form a first type of selective contact to the superlattice and the layers expose by the second beam form a second type of selective contact to the superlattice.

6. A process as in claim 3 further comprising before step (b) the steps of:
selecting the mask aperture to have the shape of a cross; and
selecting the directions of the beams so that the substrate is exposed by the first beam only through a first leg of the cross and so that the substrate is exposed by the second beam only through a second leg of the cross.

7. A process as in claim 3 further comprising the steps of:
selecting the mask aperture to have the shape of a rectangle having a plurality of rectangular projections off of one side of this rectangle; and
selecting the directions of the beams so that the first region of the substrate consists of the portions of the substrate exposed by the first beam passing through the rectangular projections of the aperture and so that the third region of the substrate consists of the portions of the substrate exposed by the second beam passing through the rectangular projections of the aperture.

8. A process as in claim 4 further comprising after step (d) the step of:
(e) forming an n-type doped region that intersects the n-type layers in the first region of the substrate, but does not intersect the layers in either the second or third regions of the substrate.

9. A process as in claim 5 further comprising after step (d) the step of:
(f) forming an p-type doped region that intersects the p-type layers in the third region of the substrate, but does not intersect the layers in either the first or second regions of the substrate.

10. A process as in claim 9 further comprising the steps of: forming an n-type metal contact in electrical contact with the doped region formed in step (e).

11. A process as in claim 9 further comprising the steps of: forming an p-type metal contact in electrical contact with the doped region formed in step (f).

* * * * *